United States Patent

[11] 3,626,259

[72] Inventors Vahan Garboushian
Torrance;
Herbert Ruzinsky, Manhatten Beach, both of Calif.

[21] Appl. No. 54,904
[22] Filed July 15, 1970
[45] Patented Dec. 7, 1971
[73] Assignee TRW Inc.
Los Angeles, Calif.

[54] HIGH-FREQUENCY SEMICONDUCTOR PACKAGE
21 Claims, 8 Drawing Figs.

[52] U.S. Cl. .......... 317/234 R, 317/235 R, 317/224 A, 317/234 G, 317/234 M, 317/235 N, 174/52, 174/DIG. 3, 174/DIG. 5
[51] Int. Cl. .......... H01l 5/00
[50] Field of Search .......... 317/234 (1), 234 (4), 234 (5.3), 234 (5.4); 174/52, DIG. 3, DIG. 5

[56] References Cited

UNITED STATES PATENTS

| | | | |
|---|---|---|---|
| 3,549,784 | 12/1970 | Hargis | 174/685.5 |
| 3,489,956 | 1/1970 | Yanai et al. | 317/234 |
| 3,566,212 | 2/1971 | Marx | 317/235 |

*Primary Examiner*—John W. Huckert
*Assistant Examiner*—B. Estrin
*Attorney*—Spensley, Horn and Lubitz

ABSTRACT: A package for a high-frequency semiconductor device. A semiconductor wafer having interdigitated active regions formed therein is mounted upon a portion of a metallized thermally conducting ceramic member. A conducting member is mounted upon and insulated from a second portion of the metallized ceramic member via a second ceramic member. The active regions of the device are contacted by interlaced, stitch bonded contacts. The metallized thermal conducting ceramic member is mounted upon a metal header, the semiconductor device being encapsulated thereon.

INVENTORS
VAHAN GARBOUSHIAN
HERBERT RULINSKY
BY THEIR ATTORNEYS
Spensley, Horn & Lubitz INVENTORS
VAHAN GARBOUSHIAN
HERBERT RUZINSKY
BY THEIR ATTORNEYS
Spensley, Horn & Lubitz INVENTORS
VAHAN GARBOUSHIAN
HERBERT RUZINSKY
BY THEIR ATTORNEYS
Spensley, Horn & Lubitz

HIGH-FREQUENCY SEMICONDUCTOR PACKAGE

BACKGROUND OF THE INVENTION

1. Field of the Invention

The present invention high-frequency semiconductor device package is generally related to the semiconductor packaging technology and, more specifically, to those devices adapted to operate at high-frequencies.

2. Prior Art

The use of semiconductor devices for high-frequency applications has expanded dramatically as heat dissipation, size and other characteristics of the device have met the strict criteria for such applications. The term high frequency as used herein shall hereinafter be understood to mean frequencies typically in the range of approximately two to four gigacycles and higher. In addition to the physical characteristics of the semiconductor device, the device disclosed by the prior art exhibit electrical characteristics which are deleterious to proper high-frequency operation. Exemplary of the problems arising out of operation of those devices disclosed by the prior art are parasitic or spurious oscillations, cross talk between elements and harmonic distortion. When operating at high frequencies, the problem exhibited by those devices disclosed by the prior art can be ameliorated by the physical packaging of the device as well as the topological geometry of the semiconductor elements.

The present invention high-frequency semiconductor device package substantially resolves those problems present in the devices disclosed by the prior art. Spurious or parasitic oscillations can arise because some part of the output of the device is inadvertently being fed back to the input. Feedback may occur through interlead capacitances, excessive lead inductance, stray wiring inductance and capacitance, etc., the exact path often being difficult to determine. The semiconductor devices disclosed by the prior art typically employ a base lead which is, by reason of the packaging, excessive in length. Where the device was packaged to be mounted on another structure, the base region of the semiconductor device was wired to a conducting substrate member over a distance which could promote parasitic oscillations due to the lead inductances, interlead capacitances, etc. The present invention high-frequency semiconductor device package substantially solves the problem of excessive lead length and therefore minimizes lead inductance through the construction thereof. Metallized thermal conducting ceramic members are adapted to provide portions to mount the semiconductor device as well as minimize the distance between the active regions and the contacting surfaces.

To further the elimination of parasitic oscillations and the generation of unwanted harmonic signals, the present invention high-frequency semiconductor package provides for the substantial elimination of deleterious effects caused by the magnetic fields generated by the current in leads connected to and from the active regions of the semiconductor device. By combining an interdigitized, topological geometry for the semiconductor device with the proper orientation of the metallized thermal conducting ceramic members, the lead wires connecting the active regions of the semiconductor device to the contact media are interlaced to cancel the opposing magnetic and electric fields. The substantial cancellation of the opposing fields yields a device which minimizes spurious or parasitic oscillations as well as the generation of unwanted harmonic distortion.

SUMMARY OF THE INVENTION

It is an object of the present invention to provide an improved, high-frequency semiconductor device package.

It is another object of the present invention to provide a semiconductor device package which minimizes lead inductance.

It is yet another object of the present invention to provide an improved, high-frequency semiconductor device package which exhibits lower levels of parasitic oscillation and harmonic distortion.

The present invention high-frequency semiconductor device package is fabricated of a series of elements stratified to adapt the structure of the final package to minimize lead length and therefore reduce parasitic oscillations and unwanted harmonic distortion. A copper header is provided, the header having a cavity for mounting the semiconductor device. A metallized thermal conducting ceramic member is mounted within the cavity. The ceramic member is totally metallized on the bottom surface which is in contact with the copper header. The top surface is metallized in two portions, the first being a U-shaped portion with the second being a T-shaped portion, the perpendicular section of the T-shaped portion being inserted within the opening of the U-shaped portion. The parallel legs of the U-shaped portion having apertures disposed therein from the top to the bottom surface of the ceramic member, the apertures being metallized thereby providing a conducting path to the copper header. A U-shaped metallized thermal conducting ceramic member is mounted upon the U-shaped metallized portion on the top surface of the first ceramic member the second member being metallized on the top and bottom surface only and being slightly smaller than the U-shaped portion upon which it is mounted. Since the second ceramic member is smaller than the metallized portion upon which it is mounted, a contact area on the U-shaped metallized portion is provided.

A semiconductor chip, typically a transistor, is mounted upon the perpendicular section of the T-shaped metallized portion on the metallized ceramic member. The transistor chip utilizes an interdigitated topological geometry for the base and emitter regions. The active regions are connected to contact surfaces through stitch bonding techniques whereby the leads are interlaced. The interlacing of the leads cancels the opposing magnetic and electric fields generated by the current conducting leads of the semiconductor device. The lead lengths are minimized by the orientation of the metallized thermal conducting ceramic members thereby reducing spurious or parasitic oscillations and the generation of unwanted harmonic distortion.

The novel features which are believed to be characteristic of the invention, both as to its organization and method of operation, together with further objectives and advantages thereof will be better understood from the following description considered in connection with the accompanying drawing in which a presently preferred embodiment of the invention is illustrated by way of example. It is to be expressly understood, however, that the drawing is for the purpose of illustration and description only, and is not intended as a definition of the limits of the invention.

DESCRIPTION OF THE PRESENTLY PREFERRED EMBODIMENT

Figure 1:
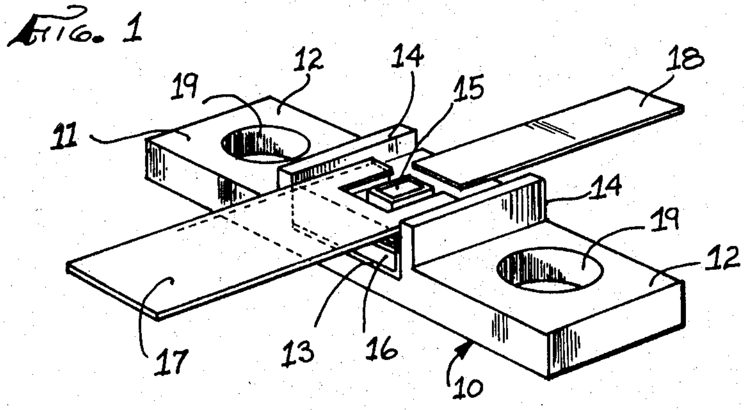
FIG. 1 is a perspective view of a semiconductor device packaged in accordance with the present invention.

Referring now to FIG. 1, an assembled semiconductor package in accordance with the present invention is shown therein, the package being generally designated by the reference numeral 10. Metal header 11 being comprised of three portions, two outer portions 12 and cavity portion 13. Cavity portion 13 is separated from outer portions 12 by parallel, vertical walls 14. Vertical walls 14 provide the outer extremities for encapsulation of the mounted semiconductor device. Semiconductor chip 15 is mounted upon a metallized thermal conducting ceramic member 16. Coplanar contact tabs 17 and 18 are secured to the present invention semiconductor device package for making contact to the active regions of semiconductor chip 15. Outer portions 12 of metal header 11 have apertures 19 disposed from the top to the bottom surface thereof to provide means for mounting header 11 within a larger assembly.

Header 11 is preferably constructed of oxygen-free high conductivity copper. The use of oxygen-free high conductivity copper is preferred because the fabrication of the present invention high-frequency semiconductor device is carried out by utilizing a brazing process in a reducing atmosphere or an atmosphere of forming gas. If oxygen was present in the copper at the time of brazing, there could be a reaction thereby causing the copper to swell and produce brazing voids. The presence of brazing voids within copper header 11 would result in degraded thermal and electrical properties for the finished product. Semiconductor chip 15 can be any conventional semiconductor device adapted for operation at high frequencies, the specific type of semiconductor device being utilized not being part of the present invention.

Figure 2:
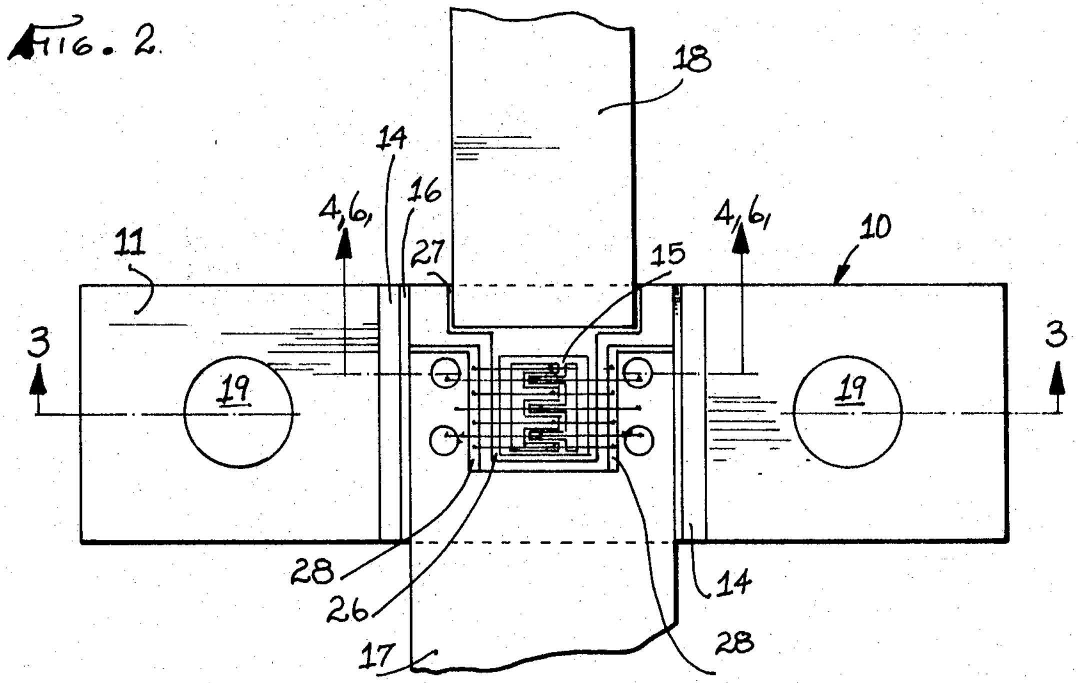
FIG. 2 is a top plan view of a semiconductor package fabricated in accordance with the present invention.

Referring now to FIG. 2, the placement of transistor chip 15 within the present invention package 10 can be best seen. Transistor 15 is mounted upon metallized layer 25 of metallized thermal conducting ceramic member 16. Metallized layer 25 is generally shaped in the form of a "T," perpendicular section 26 thereof providing the area for mounting transistor chip 15. Cross section 27 of metallized layer 25 provides the area for mounting contact tab 18. The upper surface of metallized thermal conducting ceramic member 16 also has disposed thereon metallized layer 38. Metallized layer 28 is used to provide means for reducing the lead length from an active region of transistor chip 15 thereby reducing the lead inductance and the unwanted electrical characteristics which would be present without such reduction in lead length. In the construction shown in FIG. 2, the active region representing the emitter of transistor chip 15 is connected to contact tab 17, the active region representing the base of transistor chip 15 being connected to metallized layer 28. The active region representing the collector of transistor chip 15 is connected to contact tab 18. The manner in which the connections are made to transistor chip 15 in accordance with the present invention will be more fully described hereinbelow.

Figure 4:
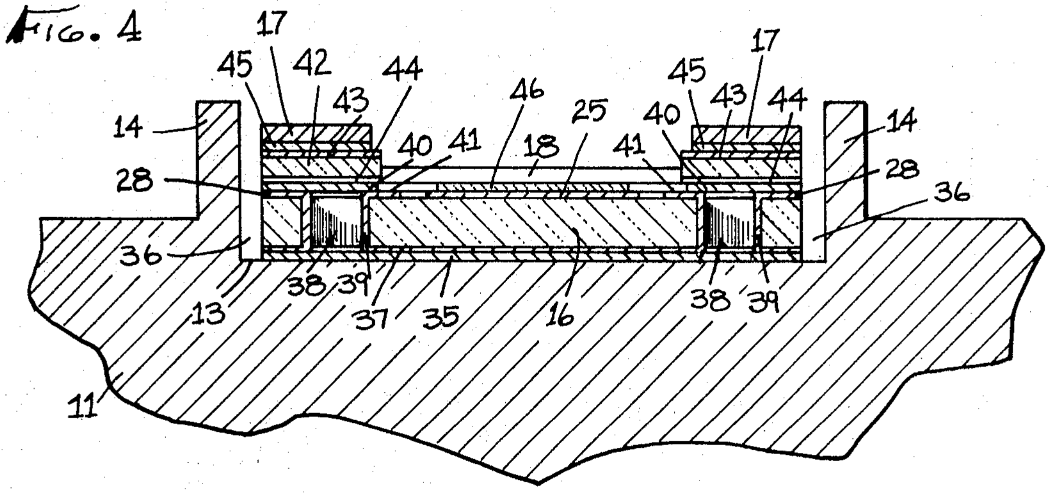
FIG. 4 is an enlarged, cross-sectional view of a form of the present invention package taken along line 4—4 of FIG. 2.
Figure 5A:
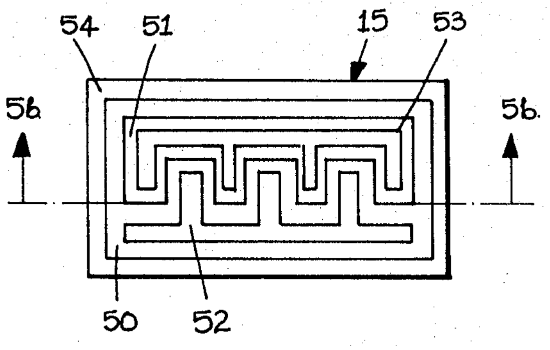
FIG. 5*a* and 5*b* are top plan and side plan views of a transistor chip used with a form of the present invention package.
Figure 5B:
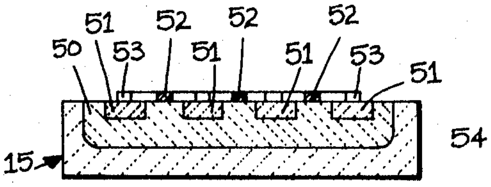

The novel elements of the present invention high-frequency semiconductor device package can be best seen by reference to FIG. 4. Cavity 13 of copper header 12 is used to hold the packaged elements. FIG. 4 illustrates a sectional view taken through line 4—4 of FIG. 2. For the purpose of clarity, that shown in FIG. 4 will be discussed with reference to the fabrication of the package itself, and therefore, reference will be had to FIG. 7 wherein the specific elements making up the assembly are shown. Eutectic preform 35 is placed upon cavity 13 of copper header 12. The transverse dimension of eutectic preform 35 leaves gaps 36 between the edges of eutectic preform 35 and walls 14. Gaps 36 provide sufficient volume for later encapsulation of the semiconductor device. Eutectic preform 35 can be a conventional eutectic material, but it is preferably a gold-silicon eutectic comprising approximately 72 percent silver and 28 percent copper, the specific composition being commercially available under the designation BT foil.

Metallized thermal conducting ceramic member 16 is placed upon eutectic preform 35. Ceramic member 16 is metallized on the top and bottom surfaces as shown in FIG. 4. Metallized layer 37 on the bottom surface of ceramic member 16 is disposed upon the entire bottom surface of ceramic layer 16 thereby making contact across its entire surface with eutectic preform 35. The metallization of the top surface of ceramic member 16 can be best seen by reference to FIG. 7. The metallized layer on the top surface of ceramic member 16 comprises tow portions, the substantially U-shaped portion 28 and the substantially T-shaped portion 25. Along the parallel leg sections of U-shaped metallized layer 28 are disposed apertures 38 from the top to the bottom of ceramic members 16. A metallized layer 39 is disposed upon the wall sections of apertures 38 thereby providing for electrical contact between metallized layer 28 and metallized layer 37. T-shaped metallized portion 25 comprises two sections, the perpendicular element 26 and the cross section 27. Perpendicular section 26 extends into the opening of the U-shaped metallized layer 18 but remains insulated therefrom. The cross section 27 extends beyond the inner limits of the parallel legs of U-shaped metallized layer 28 and, as with the case of perpendicular section 26, is insulated from metallized layer 28. Metallized layers 25, 28, 37 and 39 can be fabricated of conventional contact metals, but they are preferably fabricated of gold. Metallized thermal conducting ceramic member 16 is preferably fabricated of beryllium oxide (BeO), but ceramic member 16 could also be fabricated of aluminum oxide ($Al_2O_3$). BeO has better thermal conduction properties and therefore is more highly adapted for devices requiring high heat dissipation characteristics. Care must be taken in handling and processing BeO. BeO can be hazardous to the human respiratory system when it is in powder form, therefore, if the BeO member is to be machined or ground, care should be taken to have the proper equipment to insure that improper contact is not made.

In order to provide electrical contact for the remaining active regions of transistor chip 15, eutectic preform 40 is placed upon metallized layer 28 of ceramic member 16. Eutectic preform 40 has substantially the same shape as metallized layer 28, but the transverse distance across each of the legs of eutectic preform 40 is less than that of metallized layer 28. The lesser transverse distance between eutectic preform 40 and metallized layer 28 leaves portion 41 of each leg of metallized layer 28 exposed. The exposed portions 41 are used for making contact to one of the active regions of transistor chip 15. Eutectic preform 40 can be fabricated of conventional eutectic material, but is preferably the same as that used for eutectic preform 35, i.e., the BT foil fabricated of gold and silicon.

Figure 7:
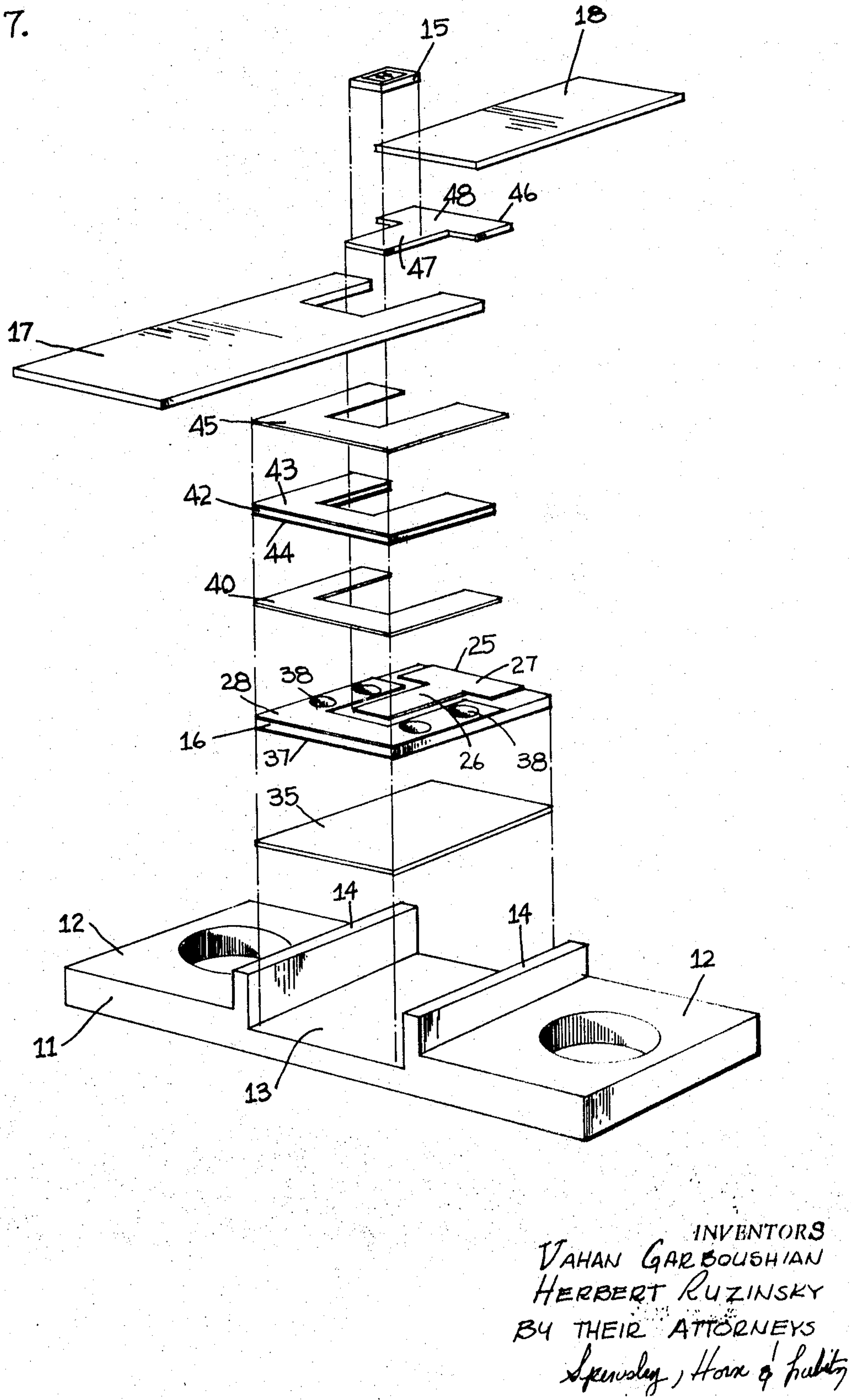
FIG. 7 is an exploded, assembly view of a semiconductor package fabricated in accordance with the present invention.

Metallized ceramic thermal conducting member 42 is disposed upon and aligned with eutectic preform 40. Referring to FIG. 7, ceramic member 42 has metallized surface 43 and 44 disposed on the top and bottom surfaces respectively, metallized surface 44 being in intimate contact with eutectic preform 40. Metallized layers 43 and 44 are isolated from each other by specifically omitting metallization of sidewalls 45 of metallized ceramic member 42. Metallized layers 43 and 44 can be fabricated of conventional contact metals, but they are preferably fabricated of gold. Metallized ceramic member 42 is fabricated from conventional thermal conducting ceramics such as beryllium oxide or aluminum oxide, but because of the decreased needs for high heat dissipation in this area of the package, the ease of processing and the lesser expense involved, metallized ceramic member 42 is preferably fabricated from aluminum oxide.

In order to provide an electrical contact to the active regions of transistor chip 15, provision must be made to attach contact tab 17. In order to connect contact tab 17 to the present invention package, eutectic preform 45 is placed upon and aligned with metallized layer 43 of ceramic member 42. Eutectic preform 45 has substantially the same U-shaped form as ceramic member 42, the transverse distance across each of the legs of eutectic preform 45 being slightly less than that of ceramic member 42. Contact tab 17 is placed upon and aligned with eutectic preform 45. Eutectic preform 45 can be conventional eutectic materials, but it is preferably the BT foil fabricated of silver and copper as described hereinabove. Contact tab 17 is fabricated of conventional contact materials which are suitable to be bonded by eutectic preform 45.

In order to provide a base for transistor chip 15, eutectic preform 46 is disposed upon and aligned with metallized layer 25. Eutectic preform 46 has substantially the same T-shaped form as metallized layer 25, preform 46 having perpendicular section 47 and top cross section 48. As with the case of the other eutectic preforms 35, 40 and 45, eutectic preform 35 is slightly smaller than metallized layer 25 to provide for expansion during the bonding process. Contact tab 18 is mounted upon and aligned with top cross section 48 of eutectic preform 46. Contact tab 18 can be fabricated of conventional contact metals suitable to be bonded with the eutectic preform 46. As with the case of the other eutectic preforms, eutectic preform 46 can be fabricated of conventional eutectic materials, but is preferably the BT foil composed of silver and copper described hereinabove.

Figure 6:
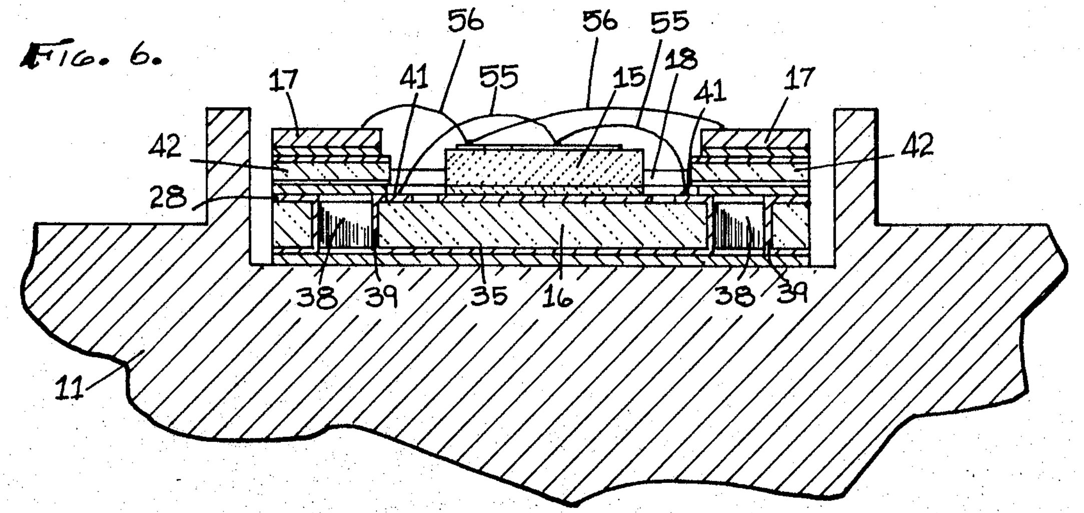
FIG. 6 is an enlarged, cross-sectional view of a transistor chip mounted upon the package shown in FIG. 4.

The manner in which transistor chip 15 is mounted within the present invention package can be best seen by reference to FIG. 6. In order to carry out the objectives of the present invention, transistor chip 15 utilizes topological geometry which is best seen by reference to FIGS. *5a* and *5b*. Transistor chip 15 is fabricated from a semiconductor wafer which is typically silicon of N-type conductivity. Base regions 50 is formed in the semiconductor wafer, with emitter region 51 being disposed within base region 50 in a manner which creates the interdigitated base and emitter regions. The interdigitated base and emitter regions 50 and 51 are formed by conventional methods and do not form a part of the present invention. Electrical contact to the active regions to the transistor chip 15 are made by disposing metallized layers 52 and 53 on the fingerlike base and emitter regions 50 and 51 respectively. Metal layers 52 and 53 are conventional contact metals. Metal layers 52 and 53 are disposed upon active regions 50 and 51 by conventional methods such as vacuum evaporation. Referring now to FIG. 6, transistor chip 15 is mounted upon perpendicular section 47 of eutectic preform 46. Collector 54 will now be in electrical contact with metallized layer 25 and contact tab 18. In order to make electrical contact to active regions 50 and 51 of transistor chip 15, stitch bonding techniques are utilized wherein lead wires extend from the interdigitated positions along metal layers 52 and 53 to the appropriate contact positions. To make electrical contact to base region 50, lead wires 55 extend from a position on metal layer 52 to exposed portions 41 of metallized layer 28. Base region 50 is thereby in electrical contact with copper header 11 through the integral connection of metallized layers 28, 39 and 37. Electrical contact to emitter region 51 is made by connecting lead wires 56 from the appropriate interdigitated positions on metal layer 53 to each of the U-shaped portions along contact tab 17. Electrical contact to the base and emitter regions 50 and 51 are made in alternative manner thereby interlacing lead wires 55 and 56. The interlacing or stitch bonding of lead wires 55 and 56 result in cancellation of the magnetic and electric fields created by the existence of current in lead wire 55 and 56. Cancellation of the opposing fields will reduce spurious or parasitic oscillations as well as aid in the prevention of unwanted harmonic distortion. Lead wires 55 and 56 can be fabricated of conventional lead material but they are preferably fabricated of gold.

When transistor chip 15 is mounted within the present invention high-frequency semiconductor device package, the objectives of minimizing lead length as well as substantially reducing parasitic oscillations and harmonic distortion are achieved. As can be seen in FIG. 6, the stratification formed by ceramic members 16 and 42 permit connection of emitter region 51 to emitter contact tab 17 by the short leads 56. In addition, the stratification of the present invention along with the metallized apertures 38 of ceramic member 16 permits connection of base region 50 to copper header 11 through the use of the short contact leads 55. Combining the structure shown in FIG. 6 with the topological geometry illustrated in FIGS. *5a* and *5b*, stitch bonding techniques are utilized to cancel the opposing fields set up by current in the leads connected to the active regions of transistor chip 15.

A better understanding of the manner in which the high-frequency semiconductor device package is assembled can be best gained by reference to FIG. 7, wherein an exploded assembly view of the present invention package is shown therein. Copper header 11 is provided, copper header being oxygen-free, high conductivity copper. It is preferred that copper header 11 be oxygen-free because the package will be subjected to a brazing process carried out in a reducing atmosphere or one of forming gas. If copper header 11 was not substantially oxygen-free, there would be a reaction wherein the copper would swell creating brazing voids. Brazing voids would necessarily degrade the thermal and electrical properties of the finished product. Copper header 11 is degreased and placed in a reducing atmosphere to purge trapped surface oxygen. Eutectic preform 35 is placed upon cavity 13 of copper header 11. As described hereinabove, eutectic preform 35 can be a conventional eutectic material, but it is preferably an eutectic comprising approximately 72 percent silver and 28 percent copper. The transverse dimension of eutectic preform 35 is slightly less than the distance between walls 14, the gaps being present to permit eutectic flow upon heating. Metallized thermal conducting ceramic member 16 is placed upon eutectic preform 35, metallized layer 37 being in intimate contact and aligned with eutectic preform 35. As set forth hereinabove, ceramic member 16 is preferably BeO. Eutectic preform 40 is placed upon and aligned with U-shaped metallized portion 28 disposed on the top surface of ceramic member 16. Eutectic preform 40 is slightly smaller than metallized portion 28, the reduction in size permitting the eutectic to flow upon heating. Metallized thermal conducting ceramic member 42 is placed upon and aligned with eutectic preform 40, metallized layer 44 on the bottom surface of ceramic member 42 being in intimate contact with eutectic preform 40. Eutectic preform 45 is placed upon and aligned with ceramic member 42, eutectic preform 45 being in intimate contact with metallized layer 43 on the top surface of ceramic member 42. Emitter contact tab 17 is placed upon eutectic preform 45, the U-shaped portion of emitter tab 17 being aligned with the U-shaped portion of eutectic preform 45 and ceramic member 42 disposed therebelow. Eutectic preform 46 is disposed upon and placed in contact with the T-shaped metallized layer 25 disposed upon the top surface of ceramic member 16. Collector contact tab 18 is placed upon and in intimate contact across member 48 of the T-shaped eutectic preform 46, collector contact tab 18 being substantially coplanar with respect to emitter contact tab 17. The elements described hereinabove are placed in a brazing jig and weighted to maintain the alignment of all elements. The means used to apply weight to the elements while in the brazing jig is fabricated of an inert material such as carbon, a ceramic or stainless steel. The inert weights will prevent any reaction with the package being assembled.

The weighted elements are placed in a furnace having a nonoxygen atmosphere, the atmosphere within the furnace being either hydrogen or conventional forming gas. The temperature of the furnace must be greater than the eutectic temperature of the particular material used to fabricate eutectic preforms 35, 40, 45 and 46. In the case where eutectic preforms 35, 40, 45 and 46 are composed of a system of 72 percent silver and 28 percent copper, eutectic temperature is approximately 779° C. Where this is the case, the temperature of the furnace will be maintained typically at a temperature of 820° C. The assembly will pass through the furnace approximately at a rate of 2 inches per minute, the total time in the furnace being within one half to 2 hours. The time within the furnace and the rate at which it passes through same will be dependent upon the specific furnace used. The assembled package will be permitted to cool to room temperature in the furnace, the furnace being maintained at the same atmospheric conditions as existed during the brazing process. This environment would be either a reducing atmosphere or one of conventional forming gas. Allowing the assembled package to cool in such an environment will prevent oxidation of cool copper header 11.

The next step in preparing the total semiconductor device is the mounting of transistor chip 15. The chip is mounted upon a solder preform and placed upon perpendicular section 47 of what was eutectic preform 46. The assembly is placed in an inert atmosphere and heated to a temperature of approximately 400° C. This will insure electrical contact between collector region 54 of transistor 15 and metallized layer 27 of ceramic member 16.

In order to fully implement the present invention, base and emitter regions 50 and 51 respectively must be connected to appropriate electrical contacts. Emitter region 51 is connected to emitter contact tab 17, base region 50 being connected to portions 41 of metallized layer 28 on the top surface of ceramic member 16. Contact leads are bonded to active regions 50 and 51 of transistor chip 15 by conventional methods such as thermocompression bonding or ultrasonic bonding. As seen in FIG. 6, lead wires 55 are mounted upon base region 50 and lead wires 56 are mounted upon emitter region 51. Lead wires 55 and 56 are preferably fabricated of gold but they can be conventional contact wires such as aluminum. As set forth hereinabove, lead wires 55 and 56 are interlaced in a stitch bonding technique. The manner of connecting lead wires from each interdigitated finger portion of metallized layers 52 and 53 on the top surface of transistor chip 15 can be best seen by reference to FIG. 2. Lead wires 55 connected to metallized layer 52 on the base region 50 are connected to portion 41 on metallized layer 28. Lead wires 56 extend from metallized layer 53 on emitter region 51 to emitter contact tab 17. The alternate connection of lead wires produces an interlaced configuration.

Figure 3:
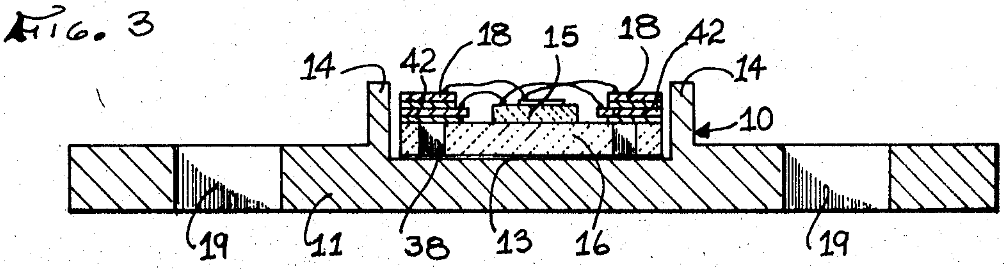
FIG. 3 is a sectional view of a semiconductor device fabricated in accordance with the present invention taken along line 3—3 of FIG. 2.

Referring now to FIG. 3, a cross section of the final product of the present invention is shown therein. The assembled product is mounted upon ans secured within cavity 13 of copper header 11. In order to protect the assembly against adverse, environmental conditions, a conformal coating of plastic or other transfer molding is disposed upon the assembly within walls 14 of copper header 11. In this manner, the entire assembly including transistor 15 and the wiring thereto will be sealed from and otherwise protected against adverse environmental conditions.

The present invention high-frequency semiconductor package produces a device which substantially reduces spurious or parasitic oscillations and prevents generation of unwanted harmonic distortion. In addition, the present invention package operates at higher frequencies, yields a greater bandwidth and produces a greater power output than those devices disclosed by the prior art.

We Claim:

1. An improved semiconductor device package comprising:
   a. a metal header having a cavity portion adapted for making thermal and electrical contact thereto;
   b. a first metallized ceramic member having top and bottom surfaces and apertures therein from the top to the bottom surface and, including a bottom metal layer disposed upon the bottom surface and a top metal layer disposed upon the top surface, the top metal layer having first and second portions disconnected from each other, the first portion integral with said apertures whereby said first portion is electrically connected to said bottom metal layer, said bottom metal layer being connected to the cavity of said metal header;
   c. a second metallized ceramic member having top and bottom surface of substantially the same shape as the first portion of the top metal layer of said first ceramic member, including a top metal layer disposed upon the top surface of said second metallized ceramic member, said bottom surface of said second metallized ceramic member connected to a part of, but not all of the first portion of the top metal layer of said first ceramic member;
   d. first and second contact means for making electrical contact thereto connected to the top metal layer of said second ceramic member and to the second portion of the top metal layer of said first metallized ceramic member respectively;

e. a semiconductor wafer having at least two active regions formed therein connected to the second portion of the top metal layer of said first metallized ceramic member; and
   f. lead means for connecting active regions of said semiconductive wafer to said first contact means and the first portion of the top metal layer of said first ceramic member whereby magnetic and electric fields are substantially cancelled.
2. A semiconductor device package as in claim 1 wherein said semiconductor wafer is a transistor chip.
3. A semiconductor device package as in claim 2 wherein said interlaced lead means comprises:
   a. first metal leads connecting portions of the base region of said transistor chip to the first portion of the top metal layer of said first ceramic member; and
   b. second metal leads interlaced with said first metal leads connecting portions of the emitter region of said transistor chip to said first contact means.
4. A semiconductor device package as in claim 1 wherein said first and second metallized ceramic members are of different type ceramics.
5. A semiconductor device package as in claim 4 wherein said first metallized ceramic member is BeO.
6. A semiconductor device package as in claim 1 wherein said metal header is oxygen-free, high conductivity copper.
7. A semiconductor device package as in claim 1 wherein the bottom surface of said second ceramic member is metallized.
8. A semiconductor device package as in claim 1 means said lead ans is interlaced leads.
9. A semiconductor device package for improving high frequency operation comprising:
   a. a copper header having first, second and third portions, the second portion separated from the first and third portion by spaced walls and adapted to receive an electrical contacting surface;
   b. a first metallized ceramic member having top, bottom and side surfaces adapted to be received by the second portion of said copper header and apertures formed in said first metallized ceramic member from the top to the bottom surface, including a first metal layer disposed on the bottom surface connected to said copper header and second and third metal layers disposed on the top surface, the second metal layer integral with said apertures whereby the second metal layer is electrically connected to the first metal layer;
   c. a second metallized ceramic member having top, bottom and side surfaces including fourth and fifth metal layers disposed on the top and bottom surfaces respectively, the fifth metal layer connected to a part, but not all of, the second metal layer;
   d. a semiconductor wafer having at least three active regions formed therein secured to the third metal layer whereby one of the active regions is in electrical contact with said third metal layer;
   e. first contact means for making electrical contact thereto connected to the third metal layer;
   f. second contact means for making electrical contact thereto connected to the fourth metal layer;
   g. first lead means for connecting the second of said active regions to said second contact means; and
   h. second lead means interlaced with said first lead means for connecting the third of said active regions to the portion of the second metal layer not connected to the fifth metal layer.
10. A semiconductor package as in claim 9 wherein said first and second metallized ceramic members are of different type ceramics.
11. A semiconductor package as in claim 10 wherein said first metallized member is fabricated of BeO.
12. A semiconductor package as in claim 10 wherein said second metallized ceramic member is fabricated of aluminum oxide.

13. A semiconductor package as in claim 9 wherein said semiconductor wafer is a transistor chip.

14. A semiconductor package as in claim 9 wherein said second metal layer comprises a first portion aligned with a side surface of said first metallized ceramic member ans second and third parallel, spaced portions extending from the transverse ends of said first portion, said second and third portions each integral with and disposed within said apertures whereby said first and second metal layers and said apertures are in electrical continuity.

15. A semiconductor package as in claim 14 wherein said third metal layer is substantially T-shaped and comprises a first portion disposed between the second and third portions of said second metal layer and a cross portion abutting an end of said first portion and transversely extending substantially equidistant on opposed sides of said first portion.

16. A semiconductor package as in claim 15 wherein said semiconductor wafer is mounted on the first portion of said third metal layer.

17. A semiconductor package as in claim 9 wherein said first and second lead means are interlaced, stitch bonded metal leads.

18. An improved package for operating semiconductor devices at high frequencies comprising:

a. a substantially oxygen-free copper header having a cavity therein adapted to receive an electrical contacting surface and means for mounting said copper header;

b. a first metallized ceramic member having top, bottom and side surfaces and apertures from the top to the bottom surfaces and having a first metal layer disposed on the bottom surface connected to said cavity and second and third metal layers on the top surface, the second metal layer being substantially U-shaped and integral with and disposed around said apertures whereby said first and second metal layers are in electrical continuity, said third metal layer being substantially T-shaped and having perpendicular and cross portions in cooperative relationship with but isolated from said second metal layer;

c. a second substantially U-shaped metallized ceramic member having top, bottom and side surfaces and fourth and fifth metal layers disposed on the top and bottom surfaces respectively, said fifth metal layer being connected to only a first portion of said second metal layer leaving a second portion thereof exposed;

d. a first metal contact having parallel, spaced extended portions at an end thereof, said extended portions connected to the fourth metal layer whereby said extended portions are on opposed sides of the perpendicular portion of said third metal layer;

e. a second metal contact connected to the third metal layer;

f. a transistor chip having a body which is the collector region thereof and base and emitter regions which are in a cooperative, interdigitated relationship with each other, said collector region connected to said third metal layer;

g. first metal leads connecting fingers of the interdigitated emitter region to each of the extended portions of said first metal contact;

h. second metal leads connecting fingers of the interdigitated base region to the exposed second portion of said second metal layer; and i. means for encapsulating said cavity.

19. A semiconductor package as in claim 18 wherein said first and second metallized ceramic members are fabricated of different ceramics.

20.

20. A semiconductor package as in claim 19 wherein said first metallized ceramic member is fabricated of BeO.

21. A semiconductor package as in claim 18 wherein said first and second metal leads are interlaced with each other.

* * * * *